United States Patent
Bertin et al.

(10) Patent No.: US 6,271,059 B1
(45) Date of Patent: *Aug. 7, 2001

(54) CHIP INTERCONNECTION STRUCTURE USING STUB TERMINALS

(75) Inventors: Claude L. Bertin, So. Burlington; William R. Tonti; Richard Q. Williams, both of Essex Junction, all of VT (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/225,148

(22) Filed: Jan. 4, 1999

(51) Int. Cl.[7] ............... H01L 21/44; H01L 21/48; H01L 21/50
(52) U.S. Cl. ............................. 438/109; 438/613
(58) Field of Search ................. 257/686, 724, 257/726, 777; 438/109, 613

(56) References Cited

U.S. PATENT DOCUMENTS

| | | | |
|---|---|---|---|
| 5,109,320 | 4/1992 | Bourdelaise et al. ............. 361/413 |
| 5,592,736 | * 1/1997 | Akram et al. .. | |
| 5,598,033 | 1/1997 | Behlen et al. ............. 257/686 |
| 5,714,800 | 2/1998 | Thompson ............. 257/690 |
| 6,020,624 | * 2/2000 | Wood et al. .. | |
| 6,069,025 | * 5/2000 | Kim . | |

OTHER PUBLICATIONS

IBM Technical Disclosure Bulletin, High Performance Test System, E. Klink et al., vol. 33, No. 1A Jun. 1990, p. 124.

IBM Technical Disclosure Bulletin, Wafer Interconnectors, A. Blum et al., vol. 32, No. 10B, Mar. 1990, p. 276.

* cited by examiner

Primary Examiner—David E. Graybill
(74) Attorney, Agent, or Firm—John J. Goodwin

(57) ABSTRACT

A method for fabricating a connector structure for interconnecting integrated circuit chips. The method includes the steps of patterning, masking and etching a substrate to form protrusions on the top and/or bottom surfaces of the substrate. Then the protrusions are preferentially etched to form truncated protrusions. An integrated circuit chip having pads on its surface is then joined to the top and/or bottom sides of the substrate. The protrusions and pads are coated with an electrically conductive metal. The substrate and the integrated circuit chips are joined and aligned together such that the truncated protrusions mate with the pads. Metal-coated vias are formed through the substrate to electrically connect the integrated circuit chips on the surfaces of the substrate.

7 Claims, 5 Drawing Sheets

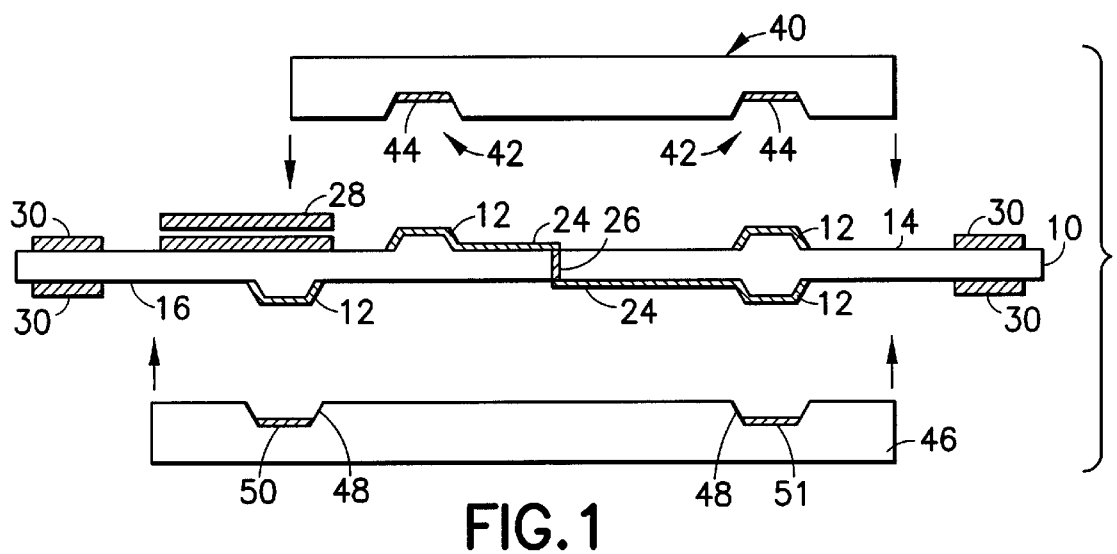
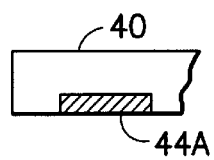 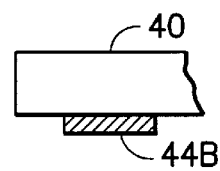
FIG. 1A    FIG. 1B
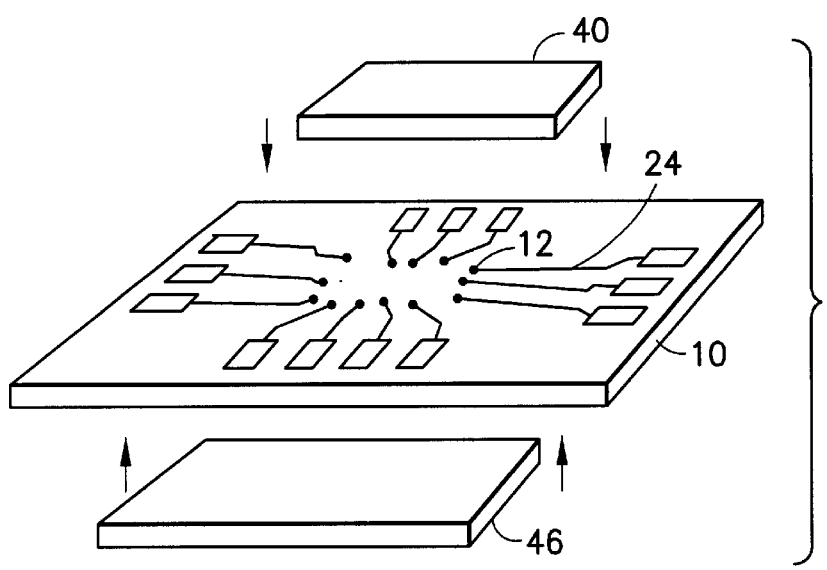
FIG. 2

CHIP INTERCONNECTION STRUCTURE USING STUB TERMINALS

BACKGROUND OF THE INVENTION

1. Technical Field

The present invention relates to fabricating integrated circuit structures, and more particularly to a structure and method for electrically interconnecting prefabricated circuit chips.

2. Background Art

An example of a technique for fabricating an integrated circuit structure having a stepped interposer is described in U.S. Pat. No. 5,714,800 issued Feb. 3, 1998 to Thompson entitled INTEGRATED CIRCUIT ASSEMBLY HAVING A STEPPED INTERPOSER AND METHOD. This reference discloses a method of forming an integrated circuit assembly having a stepped interposer, an integrated circuit die, and an encapsulant. The stepped interposer is coupled to the die and provides contact regions free from encapsulant.

U.S. Pat. No. 5,598,033 issued Jan. 28, 1997 to Behien et al. entitled MICRO BGA STACKING SCHEME describes a stacking method for micro-BGA circuits.

U.S. Pat. No. 5,109,320 issued Apr. 28, 1992 to Bourdelaise et al. entitled SYSTEM FOR INTERCONNECTING INTEGRATED CIRCUIT DIES TO A PRINTED WIRING BOARD discloses a system for electrically and mechanically connecting an integrated circuit board to a solderless printed circuit board.

The publication WAFER INTERCONNECTIONS by Blum et al. in the IBM Technical Disclosure Bulletin, Vol. 32 No. 108, Mar. 1990 at page 276 discloses a silicon wafer interconnector based on liquid contacting.

The publication HIGH-PERFORMANCE TEST SYSTEM by Klink et al. In the IBM Technical Disclosure Bulletin, Vol. 33 No. 14, Jun. 1990 at page 124 discloses a silicon carrier that is metallized and brought into contact with a wafer.

Co-pending U.S. patent application Ser. No. 09/039962, filed Mar. 16, 1998 and entitled METHOD AND APPARATUS FOR INTERCONNECTING MULTIPLE CIRCUIT CHIPS discloses a method for forming tetragonal contacts for mechanically and electrically interconnecting integrated circuit chips.

SUMMARY OF THE INVENTION

An object of the present invention is to provide a structure and fabrication method for mechanically and electrically interconnecting a plurality of circuit chips.

A further object of the present invention is to provide a selective etching method for forming protrusion terminals on the front and/or back surfaces of a connector or interposer for making mechanical and electrical contact between two circuit chips.

Another object of the present invention is to provide a circuit chip connector or interposer having one or more protrusion terminals on the top and/or bottom surfaces to align with recesses in circuit chips to be mechanically and electrically connected.

Still another object of the present invention is to provide a connector using protrusion terminals for electrically and mechanically interconnecting a plurality of standard circuit chips without modification to the original dies.

A still further object of the present invention is to provide a selective etching method for forming a chip connector having truncated pyramidal protrusions.

Other features, advantages and benefits of the present invention will become apparent in the following description taken in conjunction with the following drawings. It is to be understood that the foregoing general description and the following detailed description are exemplary and explanatory but are not to be restrictive of the invention. The accompanying drawings which are incorporated in and constitute a part of this invention and, together with the description, serve to explain the principles of the invention in general terms. Like numerals refer to like parts throughout the disclosure.

BRIEF DESCRIPTION OF THE DRAWINGS

FIG. 1 is a schematic cross-section side view of a connector having stub terminals for mechanically and electrically interconnecting multiple circuit chips according to the principles of the present invention.

FIGS. 1A and 1B illustrate alternative configurations for the contacts shown in FIG. 1

FIG. 2 is a schematic three-dimensional view of the structure of FIG. 1.

DETAILED DESCRIPTION OF THE INVENTION

Figure 3:
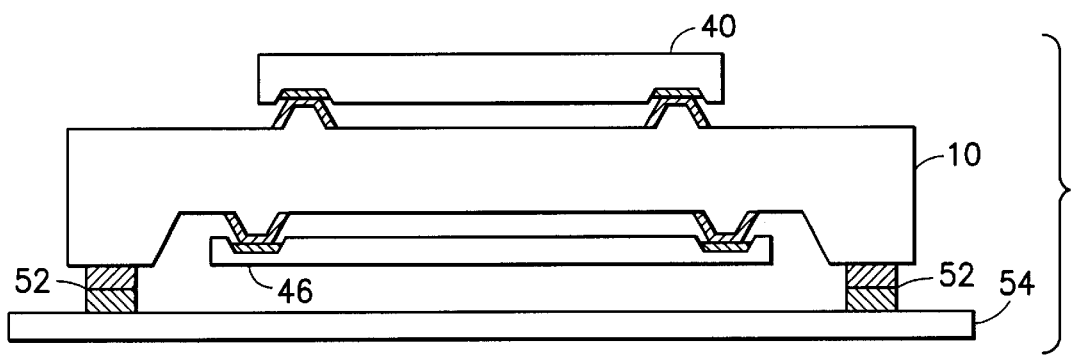
FIG. 3 is an illustration of an alternate embodiment of a circuit chip connector according to the principles of the present invention.

Referring to FIG. 1, an embodiment of the present invention is shown including a silicon connector or interposer 10 having protrusions such as stub terminals 12 fabricated on the top surface 14 and bottom surface 16.

The connector 10 can contain multilevel wiring 24, top to bottom vias 26 and circuit elements such as capacitor 28. As will be more fully described hereinbelow, the stub terminals 12 are protrusions shown for example as truncated pyramids formed by selective etching such that the sloping sides of the stub terminals allow conformal metal coverage and facilitates the wiring on the connector 10. Connector 10 also contains external terminals 30.

Referring to FIG. 1, a first integrated circuit chip 40 having pad recesses 42 containing metal pads 44 is shown disposed above connector 10. The pad recesses 42 are commonly formed on prefabricated VLSI chip for the purpose of external connection by holes in the final passivation layers for metal pads 44. Pad recesses 42 are located such that they mate with the stub terminals 12 on the top surface of connector 10 when integrated circuit chip 40 is brought into contact with connector 10. The pad recesses may be formed to have the same geometry as the stub terminals 12, for example they may be four sided if the stub terminal is tetragonal, or they may be circular or any other shape that encloses the stub terminal footprint. Although pad recesses 42 form a natural method to key the connector 10, it is understood that the recesses are not essential to the present invention and this invention could be applied to chips where processing has stopped at final pad metal.

For example, FIG. 1A illustrates an embodiment of circuit chip 40 where the contacts 44A are planar, and FIG. 1B illustrates an embodiment where the contact 44B is raised above the last finished layer of the chip. The important point is that the present invention may be used to connect to standard circuit chips without to need to modify the chips to accommodate the truncated protrusions.

Referring again to FIG. 1, a second integrated circuit chip 46 is shown disposed below connector 10. Integrated circuit chip 46, in the present example, includes pad recesses 48 containing metal pads 50. The pad recesses 48 are located such that they mate with the stub terminals 12 on the bottom surface of connector 10 when integrated circuit chip 46 is brought into contact with connector 10. In this way, connector 10 is custom-fabricated to provided electrical contacts between a plurality of prefabricated chips.

When integrated circuit chip 40 and integrated circuit chip 46 are in contact with connector 10, electrical connection is made between the two integrated circuit chips by the metal pads 44 and 50 in the recesses, the metallized stub terminals 12 and the conductive wiring 24 and vias 26 on the conductor 10.

The embodiment of FIG. 1 shows only one integrated circuit chip disposed on the top of connector 10 and only one integrated circuit chip disposed on the bottom of connector 10. It is also possible to fabricate connector 10 with a surface an area such that a plurality of separate integrated circuit chips can be placed next to each other on one or both the top and bottom surfaces thereof.

FIG. 2 is a three-dimensional view of the embodiment of FIG. 1.

FIG. 3 illustrates another embodiment of the connector of the present invention wherein the connector 10 has a recessed cavity and wherein the integrated circuit chip 46 is recessed into connector 10 such that metallization 52 can be applied to the outer edge of the connector 10 to form contacts with a printed circuit card 54. Active circuits can also be applied to either side of connector 10.

Figure 4:
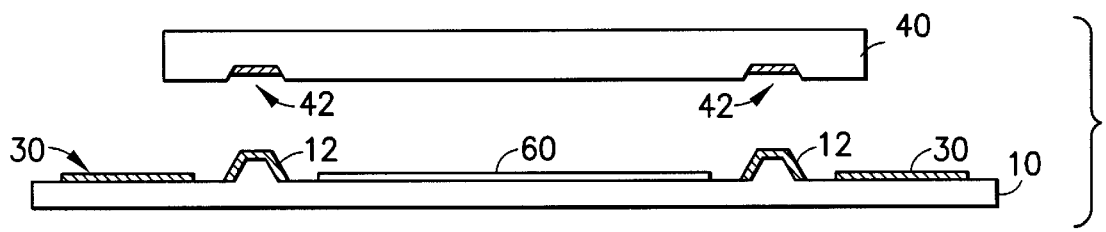
FIG. 4 is still another embodiment of a circuit chip connector according to the principles of the present invention.

FIG. 4 shows still another embodiment of the present invention with a connector 10 and a single integrated circuit chip 40 adapted to be connected to the top surface of connector 10. In this embodiment, connector 10 does not contain any stub terminals 12 on its bottom surface. The embodiment of FIG. 4 may be employed in an ASIC-like process in which custom circuits such as gate arrays are built on the top chip 40 and a connector 10 contains elements such as active circuits 60 common to all product parts. Just as in the embodiments of FIGS. 1 and 3, the active elements 60 on connector 10 may be level-shifting transistors, decoupling capacitors, power conditioning circuits, or other circuit elements.

Figure 5:
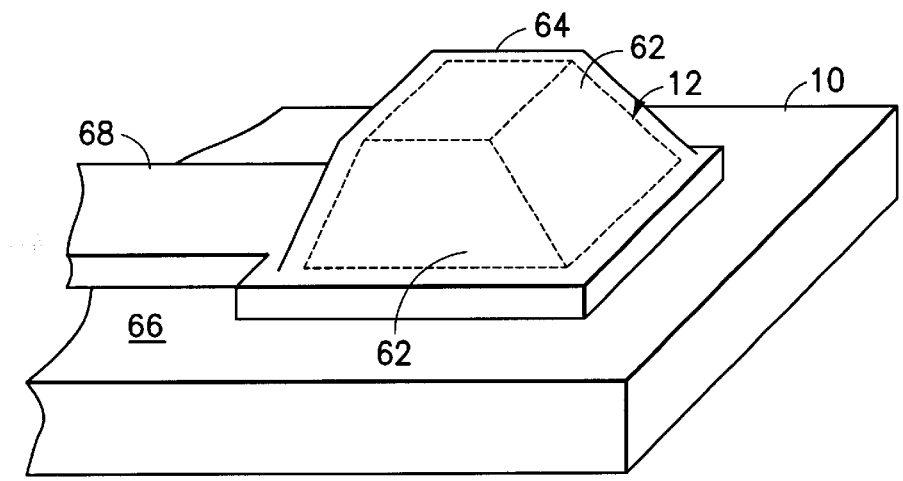
FIG. 5 is a schematic illustration of an etched silicon stub on a silicon substrate with metallization applied.

FIG. 5 shows a detailed illustration of a protrusion in the form of an etched silicon truncated pyramid stub terminal 12 with the sloped edges 62 of the stub 12 under contact metallization 64. As previously stated, protrusion 12 may be circular in cross-section to form a truncated cone, or be of another suitable geometry.

FIG. 5 also shows the silicon surface 66 of the connector 10 and a connecting wire 68. Instead of the contact metallization 64, a metal paste can be used on the top of the stub terminal 12. In the embodiment shown in FIG. 5, the pyramid protrusion is shown as a four-sided tetragon, however the pyramid is not limited to having four sides. Three, five, six or more sides may be employed. An insulating layer (or layers) is typically used to electrically isolate the metallization 64 from the silicon surface 66.

Figure 6:
FIGS. 6 through 13 illustrate steps in the fabrication of a stub according to the principles of the present invention.
Figure 7:
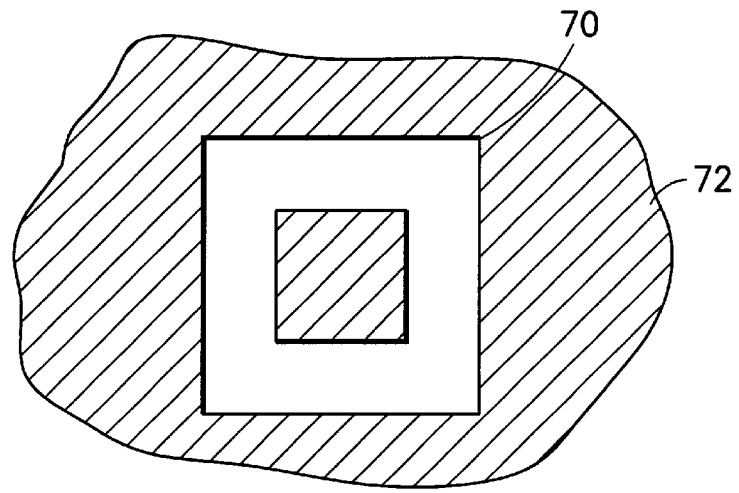

Referring to FIGS. 6 through 13, the steps of the fabrication method of the present invention are shown. FIG. 6 shows a bulk silicon wafer 10. In FIG. 7 a top view of the wafer is shown wherein the stub terminals are patterned using a mask shape 70 over a layer of photoresist 72 on the wafer.

Figure 8:
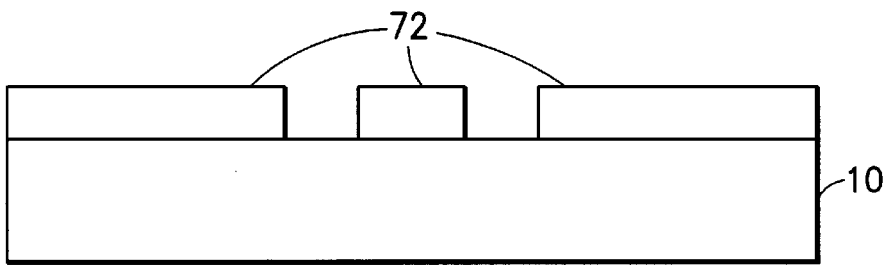

FIG. 8 shows a side view of the wafer 10 and the remaining photoresist 72 after patterning. In FIGS. 7 and 8 the process is shown relative to only one side of the connector structure.

Figure 9:
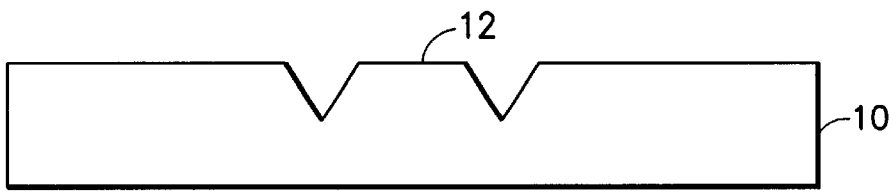

In FIG. 9, a side view of the wafer 10 is illustrated with a stub terminal 12 formed by preferentially etching substrate 10 through the patterned photoresist.

In one described embodiment of the present invention the protrusions, i.e. the stub terminals 12 formed on the surface of the connector 10 silicon wafer are chosen to be shaped like truncated pyramids. The invention uses a single etch step to form the four-sided stub. A potassium hydroxide (KOH) enchant may be used to preferentially etch the silicon in the [100] crystallographic planes faster than the [111] planes to form the angular sides of the stub terminals. Because of the high [100] etch rate of KOH, this etch step is self-limiting with the etch depth determined by the size of the mask openings in mask shape 70.

A preferential etching process for silicon that may be employed to form the sloping sides of the truncated pyramid stubs in the present invention is discussed in the publication VLSI FABRICATION PRINCIPLES, S.K. Gandhi, John Wiley and Sons, pg. 487 and the publication "An Integrated Air-Gap Capacitor Pressure Sensor and Digital Readout with Sub-100 Attofarad Resolution," IEEE Journal of Micromechanical Systems, Vol. 1, No. 3, pg. 121.

Figure 10:
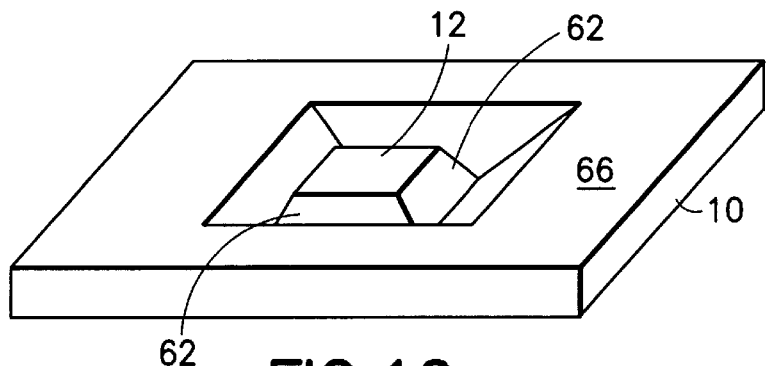

FIG. 10 is a perspective view of connector substrate 10 showing how the surface of the substrate has been etched away as described to form stub terminal 12 with sloping sides 62.

Figure 11:
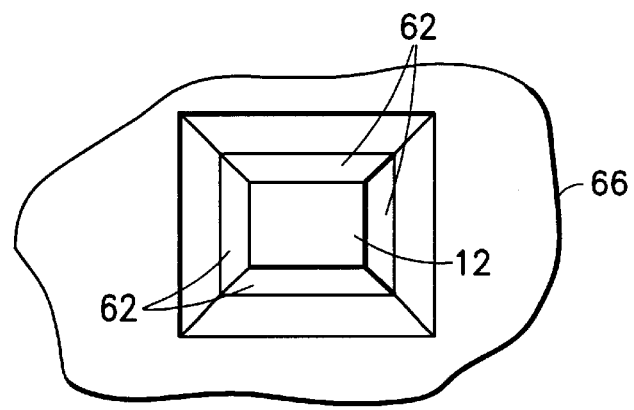

FIG. 11 is a top view of the portion of FIG. 10 showing the stub terminal 12 with sloping sides 62 disposed with the substrate surface 66.

Figure 12:
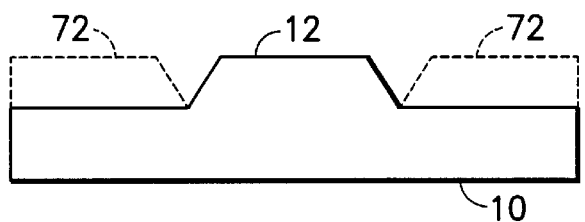
Figure 13:
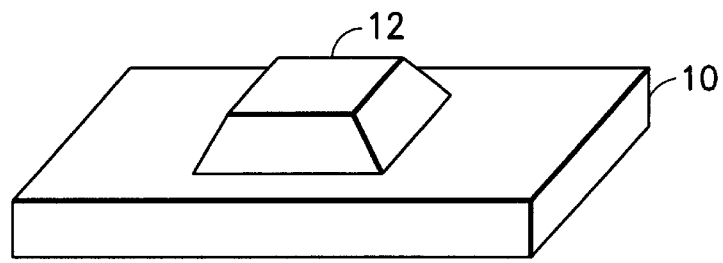

In the next step of the process the surface of the connector substrate 10 is masked off and etched away as shown in FIG. 12 to provide the final structure shown in FIG. 13 wherein the stub terminal 12 protrudes above the surface 66 of the connector substrate 10. Although the fabrication of only one stub terminal on only one side of the substrate has been described, one skilled in the art will know that a plurality of stubs can be fabricated on both top and bottom surfaces of the connector substrate using the disclosed process steps.

Figure 14:
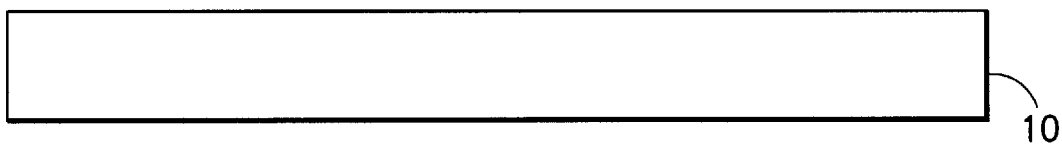
FIGS. 14 through 18 illustrate steps in the fabrication of a connector according to the principles of the present invention.

FIGS. 14 through 18 illustrate the fabrication of the entire connector structure, beginning with the silicon substrate 10 shown in FIG. 14.

Figure 15:
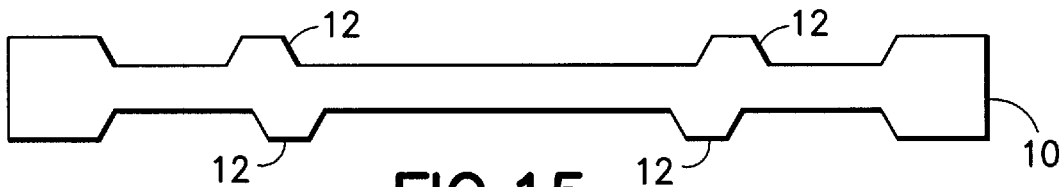

FIG. 15 shows the substrate 10 after formation of the stub terminals 12 by the etching steps as previously described.

Figure 16:
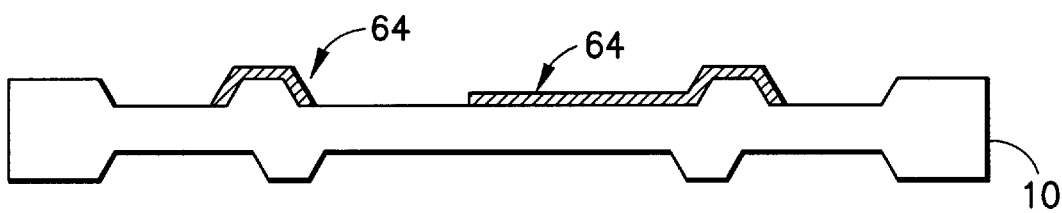

FIG. 16 shows the side view of the connector after metallization 64. At this point, optional frontside circuits are formed as well.

Figure 17:
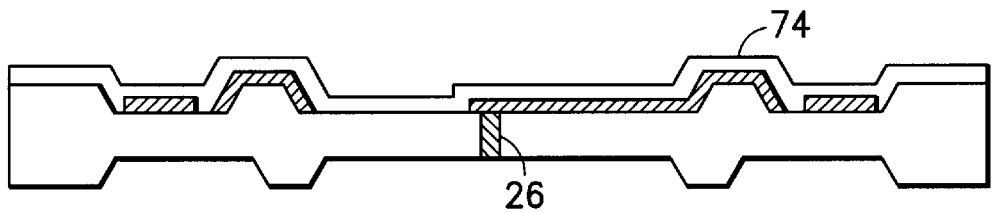

In the next step, as shown in FIG. 17, the vias 26 are formed and a protective layer 74 of, for example CVD oxide is deposited.

Figure 18:
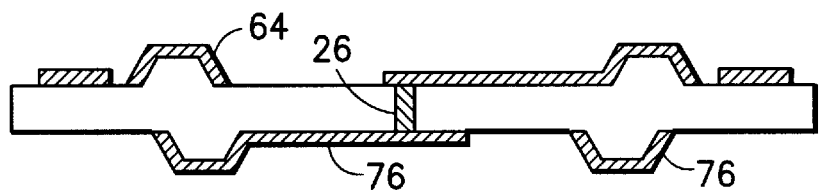

In the next step, as shown in FIG. 18, backside metallization 76 is performed, optional backside circuits 76 are formed, the protective layer 74 is removed and the structure is diced.

While the invention has been described in connection with preferred embodiments, it is not intended to limit the scope of the invention to the particular form set forth, but on the contrary, it is intended to cover such alternatives, modifications and eguivalance as may be included within the spirit and scope of the invention as defined in the appended claims.

What is claimed is:

1. A method for fabricating a connector for integrated circuit chips comprising the steps of:

patterning, masking and etching a silicon substrate to form at least one truncated protrusion having a non-piercing planar upper surface on the at least one truncated protrusion;

selectively applying an electrically conductive metal coating on the at least one surface of the substrate and the at least one truncated protrusion;

applying at least one insulating layer on the at least one substrate surface;

and aligning and joining the substrate having the at least one truncated protrusion to at least one integrated circuit chip having at least one electrically conductive metal pad wherein the at least one metal coated truncated protrusion on said substrate mates with, without piercing, the at least one conductive metal pad of the at least one integrated circuit chip and wherein the electrically conductive metal coatings thereon come into noninvasive contact.

2. A method according to claim 1 wherein the at least one electrically conductive metal pad is disposed in a recess in the integrated circuit chip.

3. A method according to claim 1 wherein the at least one electrically conductive metal pad is disposed co-planar with a surface of the integrated circuit chip.

4. A method according to claim 1 wherein the at least one electrically conductive metal pad is disposed above a surface of the integrated circuit chip.

5. A method according to claim 1 wherein the substrate is etched to form at least first and second truncated protrusions separated by an active device region, and wherein the method includes the step of fabricating an integrated circuit on the active device region of the substrate.

6. A method according to claim 5 wherein the integrated circuit of the active device region of the substrate contains standardized logic circuits and the at least one integrated circuit chip contains customized logic circuits.

7. A method for fabricating a non-invasive connector for integrated circuit chips comprising the steps of: patterning, masking and etching a silicon substrate wherein the silicon substrate is patterned, masked and etched to form a plurality of non-invasive truncated protrusions on the top and bottom surfaces of the silicon substrate, wherein metal is deposited on the plurality of truncated protrusions and wherein a first integrated circuit chip having a plurality of metal pads is aligned and joined to the top surface of the silicon substrate and a second integrated circuit chip having a plurality of metal pads is aligned and joined to the bottom surface of the silicon substrate, wherein the metal-coated truncated protrusions on the top surface of the silicon substrate mate with, without piercing, the metal pads of-the first integrated circuit chip and the metal-coated truncated protrusions on the bottom surface of the silicon substrate mate with, without piercing, the metal pads of the second integrated circuit chip, the method further including the steps of forming at least one silicon via through the silicon substrate and coating the at least one silicon via to provide electrical conduction between the top and bottom sides of the silicon substrate to electrically connect the first and second integrated circuits, and the step of arranging the truncated protrusions and metal pads to key the silicon substrate to the first and second integrated circuit chips.

* * * * *